US008316326B1

(12) United States Patent
Pierrat

(10) Patent No.: US 8,316,326 B1
(45) Date of Patent: Nov. 20, 2012

(54) SYSTEM AND METHOD FOR APPLYING PHASE EFFECTS OF MASK DIFFRACTION PATTERNS

(75) Inventor: Christophe Pierrat, Santa Clara, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 302 days.

(21) Appl. No.: 12/435,246

(22) Filed: May 4, 2009

(51) Int. Cl.
*G06F 17/50* (2006.01)
(52) U.S. Cl. ............... 716/50; 716/51; 716/54; 716/55
(58) Field of Classification Search ............... 716/50, 716/54, 55, 51, 52, 53
See application file for complete search history.

(56) References Cited

U.S. PATENT DOCUMENTS

| 6,045,976 | A | * | 4/2000 | Haruki et al. ............... 430/311 |
| 6,165,692 | A | * | 12/2000 | Kanai et al. ............... 430/311 |
| 7,005,217 | B2 | | 2/2006 | Bailey |
| 7,569,312 | B2 | * | 8/2009 | Misaka ............... 430/5 |
| 2002/0151157 | A1 | * | 10/2002 | Kim et al. ............... 438/552 |
| 2004/0013948 | A1 | | 1/2004 | Lin |
| 2005/0007567 | A1 | * | 1/2005 | Pierrat et al. ............... 355/18 |
| 2007/0184359 | A1 | * | 8/2007 | Misaka ............... 430/5 |
| 2010/0223590 | A1 | * | 9/2010 | Lippincott et al. ............... 716/19 |

OTHER PUBLICATIONS

Bubke, K., Sczyrba, M., Park, K., Neubauer, R., Pforr, R., Reichelt, J., Ziebold, R., Image Degradation due to Phase Effects in Chromeless Phase Lithography, Dresden, DE.
Ma, X. and Arce, G., PSM design for inverse lithography with partially coherent illumination, Optics Express, vol. 16, No. 24, Nov. 21, 2008.

* cited by examiner

*Primary Examiner* — Vuthe Siek
*Assistant Examiner* — Brian Ngo
(74) *Attorney, Agent, or Firm* — Kenyon & Kenyon LLP

(57) ABSTRACT

In accordance with some embodiments, a method is provided for creating a photolithographic component, comprising: determining a target pattern for a circuit layout, the target pattern comprising target features; identifying a set of periodic target features within the target pattern; calculating a relationship between feature and pitch for the set of periodic target features; and determining a mask pattern from the target pattern using the relationship, wherein the mask pattern has a set of periodic mask features configured to result in projection of a first subset of the set of periodic target features when exposed to a light source that induces a first phase effect, and configured to result in projection of a second subset of the set of periodic target features when exposed to a light source that induces a second phase effect. In further embodiments, the method outputs the mask pattern as a mask dataset.

28 Claims, 5 Drawing Sheets

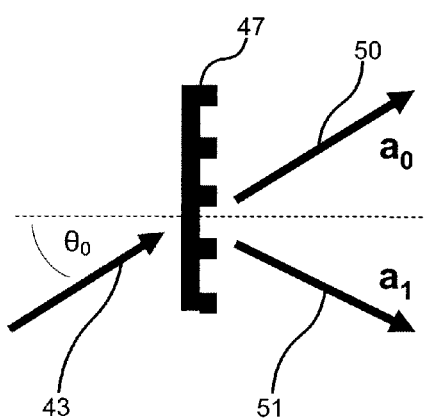
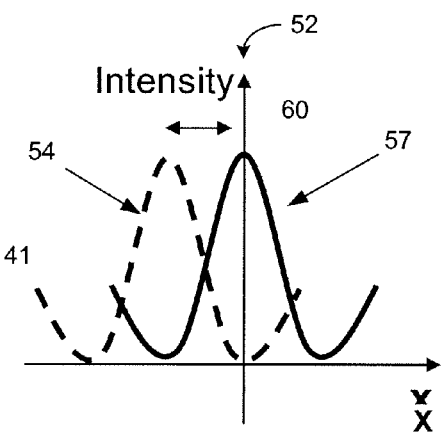
FIG. 2A
FIG. 2B
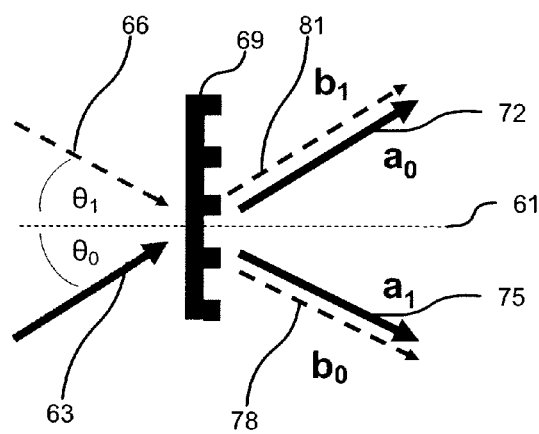
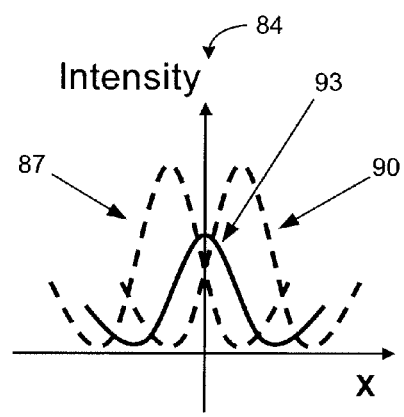
FIG. 3A
FIG. 3B

SYSTEM AND METHOD FOR APPLYING PHASE EFFECTS OF MASK DIFFRACTION PATTERNS

FIELD OF THE INVENTION

The present invention is generally directed toward creation of integrated circuits and, more particularly, various embodiments relate to utilizing phase effects for a photolithography process.

DESCRIPTION OF THE RELATED ART

Photolithography is an accepted method for creating integrated circuits. Typically, the process is facilitated by using light, usually UV light, to transfer an integrated circuit pattern onto the surface of photosensitive material (also referred to as photoresist) layered upon a wafer substrate, usually made of silicon. Depending on the type of material used and the type of light, the areas of the material exposed to the light either become susceptible to removal by a subsequent etch process while the remainder is retained, or become resistant to removal by the subsequent etch process while the remainder is removed. Thereafter, further chemical processes transfer the pattern formed by the remaining photosensitive material into the underlying substrate. Eventually, by patterning multiple layers onto the substrate in this manner, an integrated circuit is formed.

Among the multiple photolithographic techniques that exist for transferring an integrated circuit layout to a wafer surface, including contact printing and proximity printing, projection printing is the most widely utilized. Within a projection printing system, such as the one depicted in FIG. 1, light is projected through a mask (also known as a reticle) which possess one or more pattern layers of an integrated circuit. FIG. 1 illustrates an example projection printing system, wherein light 13 (e.g., UV) is projected through a condenser lens 16, which concentrates and focuses the light through a mask 19 having a mask pattern representing one of possibly several pattern layers of the integrated circuit layout. The mask pattern is typically defined by transparent and opaque regions on the mask. Conventionally, the mask 19 is placed within a stepper device (not shown), which steps the mask 13 and repeatedly exposes the exposure field of the mask to light, or a scanner device, which steps the mask 13 and the wafer 28 while scanning the exposure field of the mask with light. The resulting image projected by the light propagating through the mask 13 is focused onto the surface of wafer 28 by a projection lens 22, sometimes referred to as the reduction lens or objective lens.

However, limitations arise as feature sizes become smaller and smaller relative to the wavelength of light used within the projection printing system, and as the mask thickness increases relative to the wavelength. This is especially true when the wavelength of light ($\lambda$) utilized in the projection printing system is smaller than the size of the feature to be patterned. Based on the numerical aperture (N.A.) of the projection lens and the wavelength of the light used (along with the k coefficient, which is a process-related constant), the critical dimension (CD), or the finest sized line, resolvable by a given projection printing system is calculated by the following:

$$CD = k\frac{\lambda}{NA}$$

Accordingly, mask features smaller in size than this critical dimension cause mask pattern distortions, which translate to image distortions when projected onto the wafer. These distortions are partially due to phase effects resulting from the sub-wavelength feature sizes. Although several resolution enhancement techniques (RETs), such as phase-shift masks (PSM) and off-axis illumination (OAI), have been developed in order to overcome these resolution limitations, the techniques result in unintended phase effects. In general, the smaller in size a mask feature gets, the closer the size gets to an order of the wavelength of the light. As this occurs, the phase effects become more prominent for a given mask. These phase effects exist to some extent whether or not a resolution enhancement technique is utilized with a given mask. Unintended phase effects also arise when the thickness of the utilized mask nears that of an order of the wavelength of the light. Generally, as mask thickness increases, so does the prominence of phase effects originating from the mask.

BRIEF SUMMARY OF EMBODIMENTS OF THE INVENTION

In accordance with the invention, various embodiments are directed toward utilizing phase effects of a mask diffraction pattern to print a set of periodic circuit features onto a substrate. Specifically, according to one embodiment, a method is provided for creating a photolithographic component, comprising: determining a target pattern for a circuit layout, the target pattern comprising target features; identifying a set of periodic target features within the target pattern; calculating a relationship between feature and pitch for the set of periodic target features; and determining a mask pattern from the target pattern using the relationship, wherein the mask pattern has a set of periodic mask features configured to result in projection of a first subset of the set of periodic target features when exposed to a light source that induces a first phase effect, and configured to result in projection of a second subset of the set of periodic target features when exposed to a light source that induces a second phase effect. In further embodiments, the method outputs the mask pattern as a mask dataset.

In one embodiment, the first phase effect is a caused by a diffraction order of a mask diffraction pattern and the second phase effect is a caused by a diffraction order of a mask diffraction pattern.

In particular embodiments, the relationship between feature and pitch is a line width-to-pitch ratio for the set of periodic target features. In such embodiments, the line width-to-pitch ratio for the set of periodic target features is smaller than a line width-to-pitch ratio for the set of periodic mask features.

In some embodiments, determining the mask pattern includes simulating the first phase effect of a light source on the mask pattern and simulating the second phase effect of a light source on the mask pattern to determine the mask pattern. Within some of these embodiments, the operations of simulating the first phase effect and simulating the second phase effect are performed iteratively or concurrently.

In more embodiments, determining the mask pattern includes determining a mask type, addition of non-printing mask features, adjusting mask features with respect to the target features, determining optical constants for a mask material, and determining mask thickness.

In other embodiments, the first phase effect is a first order of a mask diffraction pattern and the second phase effect is a second order of a mask diffraction pattern. Within some of these embodiments, a mask diffraction pattern results from a light wave contacting the mask surface at a specific angle of incidence.

In various embodiments, a light source causing the first phase effect has a first configuration, a light source causing the second phase effect has a second configuration, and the first and second configurations include off-axis illumination settings, exposure dose, lens focus, exposure method, frequency of light, phase of light, polarization of light, and numerical-aperture of the lens.

In certain embodiments, the set of periodic mask features are configured to facilitate specific photolithography techniques utilized in further increasing feature resolution and/or feature density on a wafer surface. For example, the set of periodic features can be further configured to facilitate double patterning or self-aligned double patterning of the set of periodic target features. However, in no way is the invention limited to such an embodiment implementing double patterning or self-aligned double patterning and, as such, a person of ordinary skill in the art will recognize and appreciate other resolution enhancement techniques to which aspects of this invention may be applicable.

Further embodiments include computer-aided design tools and computer program products embodying limitations similar to those detailed above with respect to the method.

Other features and aspects of the invention will become apparent from the following detailed description, taken in conjunction with the accompanying drawings, which illustrate, by way of example, the features in accordance with embodiments of the invention. The summary is not intended to limit the scope of the invention, which is defined solely by the claims attached hereto.

BRIEF DESCRIPTION OF THE DRAWINGS

The present invention, in accordance with one or more various embodiments, is described in detail with reference to the following figures. The drawings are provided for purposes of illustration only and merely depict typical or example embodiments of the invention. These drawings are provided to facilitate the reader's understanding of the invention and shall not be considered limiting of the breadth, scope, or applicability of the invention. It should be noted that for clarity and ease of illustration these drawings are not necessarily made to scale.

FIG. 2A is a diagram illustrating an example monopole off-axis illumination configuration that can be used in conjunction with an embodiment of the present invention.

FIG. 2B is a graph depicting an example effect when using a monopole off-axis illumination configuration.

FIG. 3A is a diagram illustrating an example dipole off-axis illumination configuration that can be used in conjunction with an embodiment of the present invention.

FIG. 3B is a graph depicting an example effect when using a dipole off-axis illumination configuration.

DETAILED DESCRIPTION OF THE EMBODIMENTS OF THE INVENTION

Embodiments in accordance with the present invention are related to optical photolithography for integrated circuits and, more specifically, provide systems and methods for generating and applying phase effects of a mask diffraction pattern within integrated circuit patterning.

Before describing the invention in detail, it is useful to describe a few example resolution enhancement techniques with which the invention can be implemented, such as phase-shift masks (PSM) and off-axis illumination (OAI).

With phase-shift masks (also referred to as phase-shifting mask method), the phase of the light propagating through a phase-shifting mask is intentionally shifted to result in favorable constructive and destructive interference between light beams. This constructive and destructive interference, in turn, results in a light pattern having both bright and dark areas, which clearly delineate certain mask features. Subsequently, this light pattern is projected by a lens onto the wafer, thereby patterning those delineated features onto the photosensitive layer. In doing so, phase shift masks not only produce feature sizes that are about half the width of features sizes created using ordinary masks, but phase shift masks also reduce unintended phase effects (e.g., diffraction) ordinarily caused by non-phase shift masks.

The two most common phase-shift masks are attenuated phase-shift masks (atten.PSM) and alternating-aperture phase-shift masks (alt.PSM). In the former, certain light blocking regions of a mask are modified such that they allow a small amount of light to be transmitted through. This small amount of light, though not strong enough to create a pattern on the photosensitive layer of the wafer, is strong enough to interfere with the light being transmitted through the transmitting regions. In the latter method, particular regions of the mask that transmit light are etched to be thicker or thinner than the remainder of the transmitting regions, thereby inducing a phase-shift in the light propagating through those modified regions.

Figure 1:
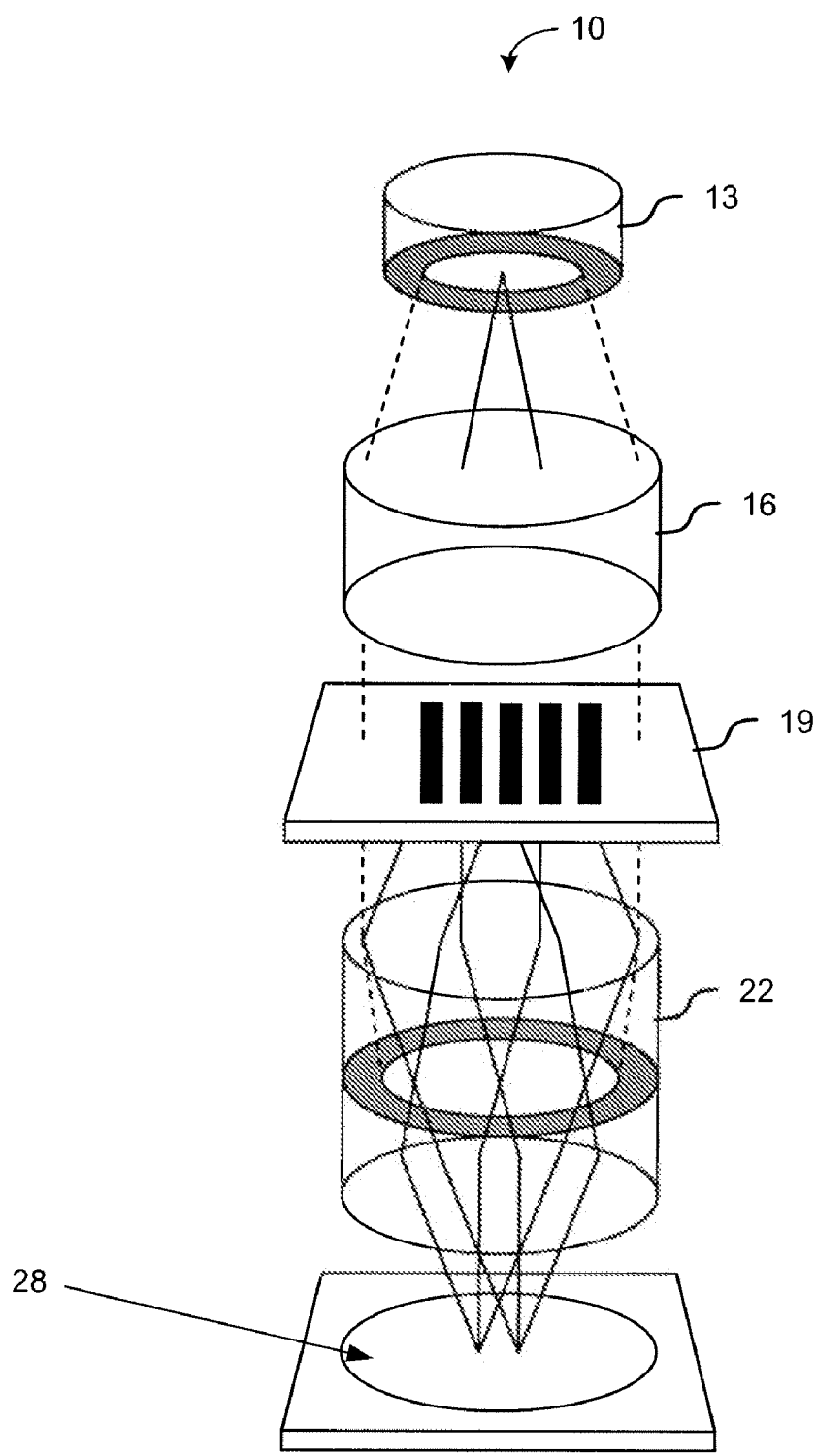
FIG. 1 is a diagram illustrating an example projecting printing system used in optical lithography and in accordance with one embodiment of the present invention.

The other example resolution enhancement technique (RET), off-axis illumination (OAI), entails tilting the light incident to a mask away from the normal angle of incidence, thereby resulting in a shifted diffraction pattern that is then transmitted into the projection lens. For mask patterns having repeated, periodic features (e.g., an array of line features), the diffraction pattern produced using off-axis illumination comprises a set of discrete light points referred to as diffraction orders. Due to the finite size of the projection lens (e.g., lens 22 in FIG. 1), only a portion of the diffraction orders can actually be captured and travel through the lens. Generally, the objective of off-axis illumination is to tilt the light incident the mask to such a degree to position the shifted diffraction pattern, and thereby the diffraction orders, evenly about the center of the lens, which is the optical axis of the projection printing system. Effectively, this increases the depth of focus of the image projected onto the wafer, especially for small pitch periodic feature patterns. The distance between the 0th and 1st diffracted orders for a given mask pattern is provided by the equation $$\frac{1}{p},$$

where p is the pitch of the periodic feature pattern. When patterning dense features, generally it is only the 0th and 1st diffraction orders that are captured by the objective lens. To better illustrate how unintended phase effects play a role in off-axis illumination, we now refer to FIGS. 2A and 3A.

In FIG. 2A, the phase effects of an example monopole (i.e., single light source) off-axis illumination configuration are illustrated. The light beam 43 from a single light source propagates toward mask 47 at an angle of incidence, $\theta_0$, with respect to the optical axis 41 of the project system; optical axis 41 represents the normal angle of incidence with mask 47. This results a diffracted pattern of light out of the other end of mask 47, wherein the pattern comprises light beam $a_0$ and light beam $a_1$ (beams 50 and 51, respectively). Light beams $a_0$ and $a_1$ represent the 0th and 1st diffraction orders of the diffraction pattern, respectively.

Consequently, with monopole off-axis illumination, the 0th and 1st diffraction orders are displaced from the optical axis 41, as illustrated in the position vs. intensity graph 52 of FIG. 2B. The position axis corresponds to a position on the wafer surface. Although displacement of the diffraction orders causes higher depth of field on the wafer surface (i.e., higher contrast 57 on the wafer), it also results in a phase effect 54 due to beam 51. Graph 52 illustrates how this results in a displacement error 60 between the light intensity 57 on the wafer surface, and the light intensity 54 of the phase effect.

Within FIG. 3A, the phase effects of an example dipole (i.e., dipole light source) off-axis illumination configuration are illustrated. Here there are two light sources, each providing their own light beam (i.e., light beam 63 and light beam 66). As these light beams 63, 66 contact mask 69, a diffraction pattern results for each light beam 63, 66. One diffraction pattern for light beam 63, comprising light beams $a_0$ and $a_1$ (beams 72 and 75, respectively), and the other diffraction pattern for light beam 66, comprising light beams $b_0$ and $b_1$ (beams 78 and 81, respectively). Within the context of this dipole configuration, the light sources are symmetrically oriented around the optical axis 61, such that the phase effects $a_1$ and $b_1$ are respectively mitigated by $b_0$ and $a_0$, thereby mitigating (i.e., averaging) the displacement error caused by unintended phase effect observed in FIG. 2A. However, in doing so, there is a loss of contrast of the image projected to the wafer surface, as observed at contrast curve 93 in graph 84 of FIG. 3B.

From time-to-time, the present invention is described herein in terms of embodiments employing these example resolution enhancement techniques. Description in terms of these techniques is provided to allow the various features and embodiments of the invention to be portrayed in the context of an exemplary application. After reading this description, it will become apparent to one of ordinary skill in the art how the invention can be implemented with different and alternative techniques that may be used for photolithography.

Figure 4:
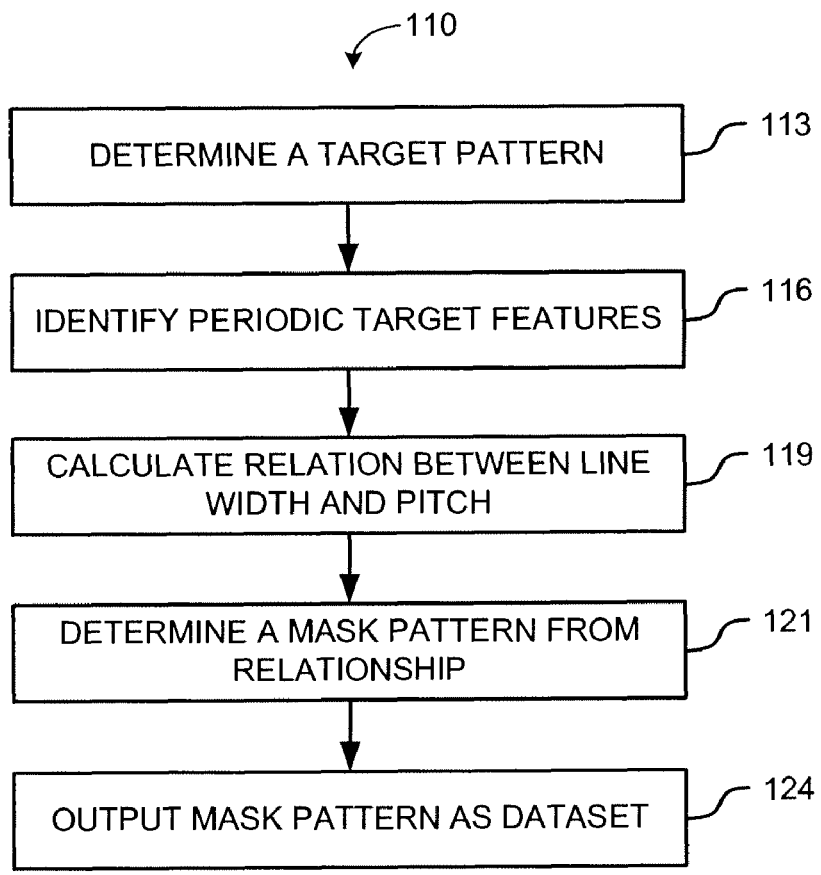
FIG. 4 is a flowchart illustrating an example method in accordance with one embodiment of the present invention.

Various embodiments of the invention relate to mask patterns and methods for defining and creating mask patterns that considers the phase effects of light transmission and utilizes them in a constructive manner to pattern desired features onto a wafer surface. Referring now to FIG. 4, flowchart 110 is depicted showing an example method in accordance with one embodiment of the present invention. The method begins with operation 113, wherein a target pattern is determined. Within this particular operation, the target pattern can be a pre-existing pattern received by a design tool for processing. For example, in one embodiment, the design tool receives a dataset representing a photomask pattern for a layer of an integrated circuit design. In another instance, target pattern may be actively created and modified within a computer aided design (CAD) tool configured to design and generate integrated circuit layouts. After reading this disclosure, one of ordinary skill in the art would appreciate there exist multiple methods for obtaining a given target pattern.

Subsequent to determining the target pattern, the method 110 identifies a set of features within the target pattern that are arranged in a periodic configuration. For example, such a set of periodic features may be an array of dense line features patterned within the circuit layout. Such a pattern is typically found, for example, as word lines within a memory circuit. Another example may be a set of pads or contacts arranged in a periodic format within the target pattern. For the purposes of this disclosure, this identified set of features is referred to as a set of periodic target features.

Upon identifying the set of periodic target features, a spatial relationship such as the relationship between the width of the features within the set and their spacing, or the width of the features and their pitch is calculated at operation 116. An example of such a relationship could be a line width-to-pitch ratio, which is commonly used as a measurement for dense arrays of lines.

Within operation 121, the relationship determined in operation 116 is utilized to determine a mask pattern that would enable patterning the target pattern, and in particular, the set of periodic target features. For example, in a situation where the periodic target features are too narrow or spaced too close for patterning given the available lithography parameters, a mask pattern is calculated that, when combined with phase shift techniques, allows patterning the target features despite optical limitations of the lithography process. The set of periodic mask features that is defined to correspond to the identified set of periodic target features is configured to result in a first subset of the target features when exposed to a first light configuration, and a second subset of the target features when exposed to a second light configuration. That is, when the set of periodic mask features is exposed to light utilized in the projection printing system (e.g., FIG. 1) under a first light configuration a first subset of the set of periodic target features is projected onto a wafer surface. Then, when the same set of periodic mask features is exposed to the light utilized under a second light configuration, a second subset of the set of periodic target features is projected onto the wafer surface. Example parameters for a light configuration include, but are not limited to, off-axis illumination settings, exposure dose, lens focus, exposure method, frequency of light, phase of light, polarization of light, and numerical-aperture of the lens. The resultant calculated mask pattern having the set of periodic mask features can outputted as a dataset for mask preparation. This dataset can subsequently be applied to create a physical mask (also known as a reticle) for a projection printing system.

Continuing with operation 121 in further detail, various embodiments determine the set of periodic mask features by simulating a first phase effect on the set of periodic mask features under the first light configurations, and then simulating a second phase effect on the same set of periodic mask features under a second light configuration. The resultant pattern can be compared against the target pattern to verify the accuracy with which the target is achieved. Known relationships between the phase of the light, the angle of incidence of the light on the pattern and the spatial characteristics of the pattern (e.g., pitch-width ratio) can be used to specify the system for modeling. In some instances, the first and second phase effects can be determined by a diffraction order of a given mask diffraction pattern. For example, the operation 121 uses the first phase effect on a given mask feature within the set of periodic mask features to simulate projecting a first image onto the wafer. This is a first target feature or first target feature subset from within the set of periodic target patterns. The simulation can also utilize the second phase effect on the same mask feature within the set of periodic mask feature to project a second image onto the wafer (i.e., a second target feature from within the set of periodic target patterns). Some embodiments simulate these phase effects by performing a Fourier transform on the mask's transmission function, which models the projection from a given mask. For thin, binary masks, this involves a Fourier transform on a transmission function where regions of the mask that are transparent are 1, and regions that are opaque are 0. In instances where a phase-shifting mask is utilized, the simulation of phase effects involves solving Maxwell's equations as the electromagnetic field (i.e., the light) passes through the phase-shifting mask. Simulations of phase effects can be performed on a variety of mask types (e.g., chromeless phase-shifting mask, alternating phase-shifting mask, attenuated phase-shifting mask).

It should also be noted that within various embodiments, the process of simulating phase effects can be iterative or concurrent. For example, in some embodiments using concurrent processing, the phase effect resulting from a first light beam incident a mask feature within the set of periodic mask features can be simulated at the same time the phase effect resulting from a second light beam incident the same mask feature is simulated. Regarding embodiments utilizing iterative processing, an example can include simulating the phase effects on light emanating from a first mask feature within a set of periodic mask features, adjusting the first mask feature to create the desired phase effect (i.e., a first image that can be patterned onto a wafer), and again simulating the phase effects on the light emanating from the adjusted first mask feature. Such iterations can continue for the first phase effect and the second phase effect, to reach the desired result of a mask feature that project a first image under a first light configuration, and the same mask feature that projects a second image under a second light configuration.

There also exist embodiments where determining the mask pattern in operation 121 involves adjusting various aspects of the mask to achieve the desired phase effects in accordance with this invention. For such embodiments, the process of determining the mask pattern (and particularly, the set of periodic mask features) can involve determining the mask type, adding non-printing mask features, adjusting mask features with respect to the target features, adjusting a shape of mask features, determining optical constants for a mask material, and determining mask thickness.

In terms of light configuration, particular embodiments of the invention utilize one or more light configurations during simulation of phase effects for a given mask. Some of these light configurations can include resolution enhancement techniques, such as off-axis illumination (OAI). Within off-axis illumination, the mode of illumination can comprise monopole, dipole, quadrupole, or annular modes. Other forms of light configuration can include exposure dose (e.g., amplitude of light), lens focus, exposure method (e.g., scanner or stepper), frequency of light (e.g, UV, X-ray), phase of light, polarization of light (e.g., TE), and the numerical-aperture of the lens used in the projection printing system. After reading this disclosure, a person of ordinary skill in the art would appreciate that other forms of light configuration within a printing projection system can also be utilized.

Figure 5:
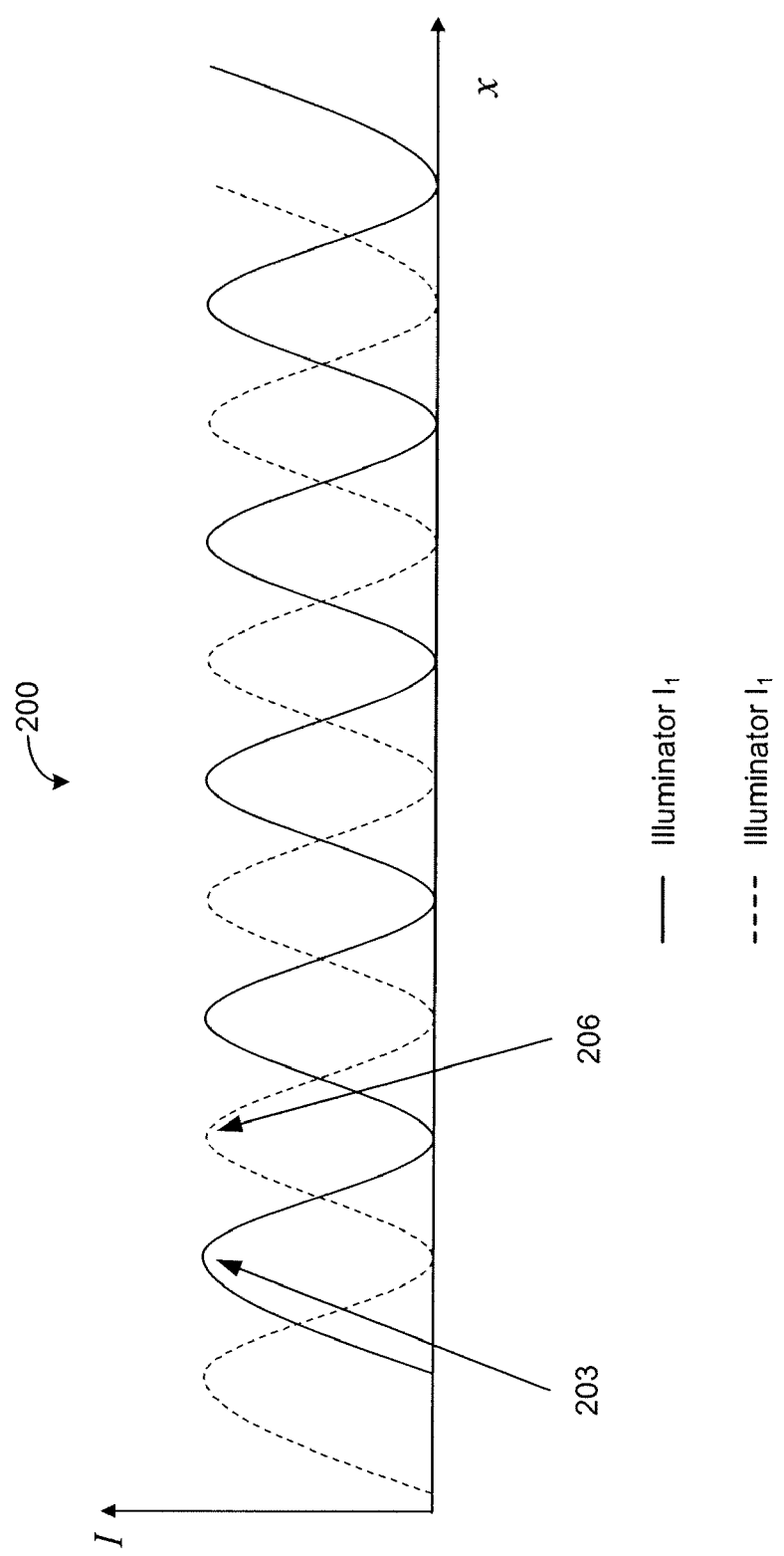
FIG. 5 is a graph illustrating an example of how an embodiment of the present invention can utilize phase effects.

Referring now to FIG. 5, a graph 200 is provided depicting how certain embodiments of the invention utilize phase effects to pattern two different images onto a wafer surface. Within this graph 200, showing intensity of light at a given position X on the wafer surface, it is shown how adjusting a mask feature, adjusting a light configuration, and adjusting physical aspects of the mask can yield a 90 degree phase difference between light intensity 203 caused by Illuminator $I_1$ and light intensity 206 caused by Illuminator $I_2$. In some embodiments, such a shift in light intensity can be utilized in a double patterning process. For instance, with respect to graph 200, Illuminator $I_1$ with light intensity 203 could be the first exposure in the double patterning process, followed by a second exposure via light intensity 206 emanating from Illuminator $I_2$. Accordingly, in particular embodiments, the two different exposures resulting on the wafer can be created using one mask with two different illumination conditions.

For some embodiments, in addition to the single mask for two exposures increasing the throughput of the projection printing system (since masks don't need to be changed between the first and second exposure), the use of one mask can mitigate alignment errors that might arise from changing of masks. The single mask also lessens the cost of production integrated circuit production by eliminating the need for a second mask.

The term tool can be used to refer to any apparatus configured to perform a recited function. For example, tools can include a collection of one or more modules and can also be comprised of hardware, software or a combination thereof. Thus, for example, a tool can be a collection of one or more software modules, hardware modules, software/hardware modules or any combination or permutation thereof. As another example, a tool can be a computing device or other appliance on which software runs or in which hardware is implemented.

Figure 6:
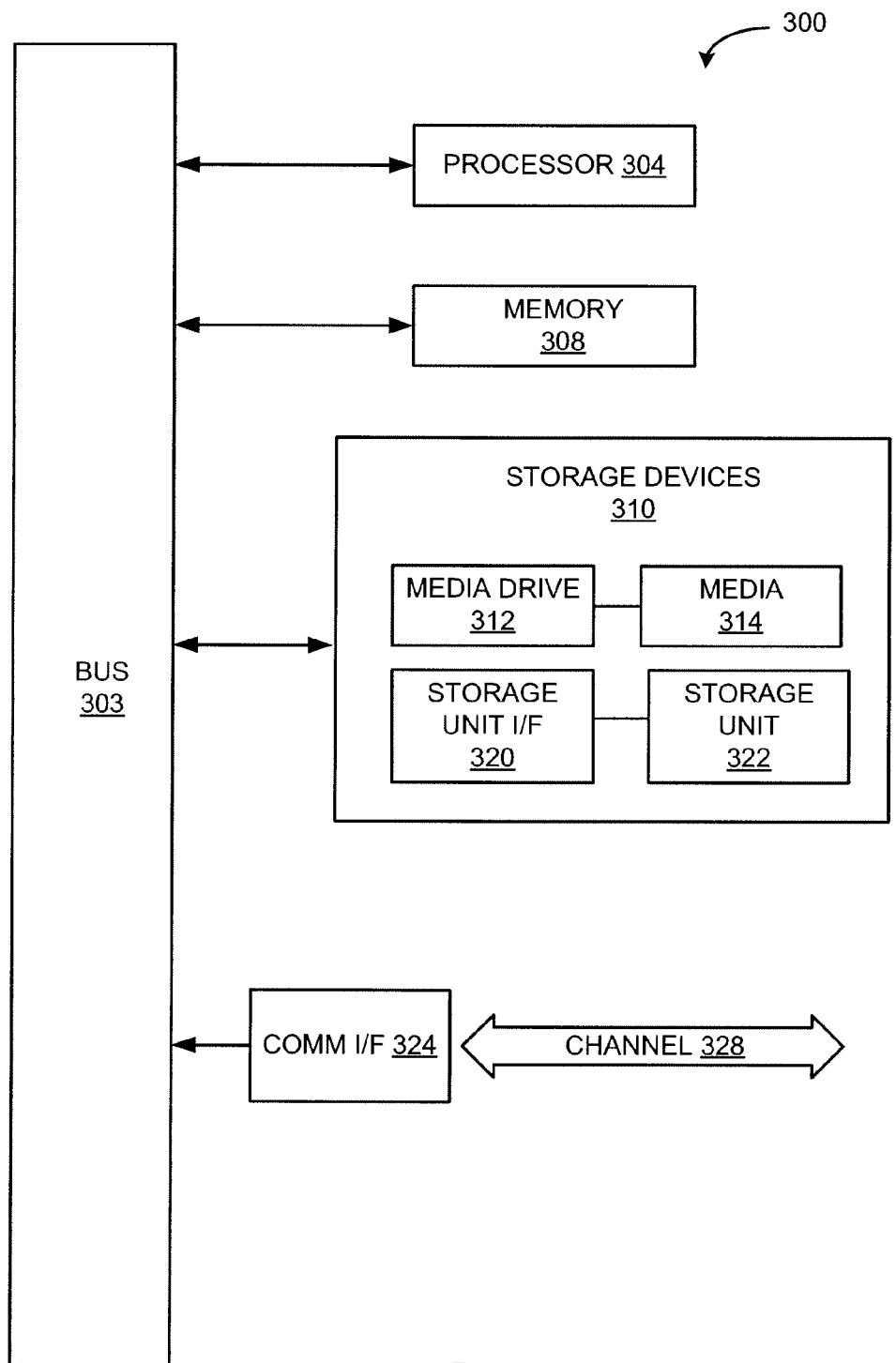
FIG. 6 is a simplified block diagram illustrating an example-computing module in accordance with one embodiment of the invention.

As used herein, the term module might describe a given unit of functionality that can be performed in accordance with one or more embodiments of the present invention. As used herein, a module might be implemented utilizing any form of hardware, software, or a combination thereof. For example, one or more processors, controllers, ASICs, PLAs, logical components, software routines or other mechanisms might be implemented to make up a module. In implementation, the various modules described herein might be implemented as discrete modules or the functions and features described can be shared in part or in total among one or more modules. In other words, as would be apparent to one of ordinary skill in the art after reading this description, the various features and functionality described herein may be implemented in any given application and can be implemented in one or more separate or shared modules in various combinations and permutations. Even though various features or elements of functionality may be individually described or claimed as separate modules, one of ordinary skill in the art will understand that these features and functionality can be shared among one or more common software and hardware elements, and such description shall not require or imply that separate hardware or software components are used to implement such features or functionality.

Where components or modules of the invention are implemented in whole or in part using software, in one embodiment, these software elements can be implemented to operate with a computing or processing module capable of carrying out the functionality described with respect thereto. One such example-computing module is shown in FIG. 6. Various embodiments are described in terms of this example-computing module 300. After reading this description, it will become apparent to a person skilled in the relevant art how to implement the invention using other computing modules or architectures.

Referring now to FIG. 6, computing module 300 may represent, for example, computing or processing capabilities found within desktop, laptop and notebook computers; handheld computing devices (PDA's, smart phones, cell phones, palmtops, etc.); mainframes, supercomputers, workstations or servers; or any other type of special-purpose or general-purpose computing devices as may be desirable or appropriate for a given application or environment. Computing module 300 might also represent computing capabilities embedded within or otherwise available to a given device. For example, a computing module might be found in other electronic devices such as, for example, digital cameras, navigation systems, cellular telephones, portable computing devices, modems, routers, WAPs, terminals and other electronic devices that might include some form of processing capability.

Computing module 300 might include, for example, one or more processors, controllers, control modules, or other processing devices, such as a processor 304. Processor 304 might be implemented using a general-purpose or special-purpose processing engine such as, for example, a microprocessor, controller, or other control logic. In the example illustrated in FIG. 3, processor 304 is connected to a bus 303, although any communication medium can be used to facilitate interaction with other components of computing module 300 or to communicate externally.

Computing module 300 might also include one or more memory modules, simply referred to herein as main memory 308. For example, preferably random access memory (RAM) or other dynamic memory, might be used for storing information and instructions to be executed by processor 304. Main memory 308 might also be used for storing temporary variables or other intermediate information during execution of instructions to be executed by processor 304. Computing module 300 might likewise include a read only memory ("ROM") or other static storage device coupled to bus 303 for storing static information and instructions for processor 304.

The computing module 300 might also include one or more various forms of information storage mechanism 310, which might include, for example, a media drive 312 and a storage unit interface 320. The media drive 312 might include a drive or other mechanism to support fixed or removable storage media 314. For example, a hard disk drive, a floppy disk drive, a magnetic tape drive, an optical disk drive, a CD or DVD drive (R or RW), or other removable or fixed media drive might be provided. Accordingly, storage media 314, might include, for example, a hard disk, a floppy disk, magnetic tape, cartridge, optical disk, a CD or DVD, or other fixed or removable medium that is read by, written to or accessed by media drive 312. As these examples illustrate, the storage media 314 can include a computer usable storage medium having stored therein computer software or data.

In alternative embodiments, information storage mechanism 310 might include other similar instrumentalities for allowing computer programs or other instructions or data to be loaded into computing module 300. Such instrumentalities might include, for example, a fixed or removable storage unit 322 and an interface 320. Examples of such storage units 322 and interfaces 320 can include a program cartridge and cartridge interface, a removable memory (for example, a flash memory or other removable memory module) and memory slot, a PCMCIA slot and card, and other fixed or removable storage units 322 and interfaces 320 that allow software and data to be transferred from the storage unit 322 to computing module 300.

Computing module 300 might also include a communications interface 324. Communications interface 324 might be used to allow software and data to be transferred between computing module 300 and external devices. Examples of communications interface 324 might include a modem or softmodem, a network interface (such as an Ethernet, network interface card, WiMedia, IEEE 802.XX or other interface), a communications port (such as for example, a USB port, IR port, RS232 port Bluetooth® interface, or other port), or other communications interface. Software and data transferred via communications interface 324 might typically be carried on signals, which can be electronic, electromagnetic (which includes optical) or other signals capable of being exchanged by a given communications interface 324. These signals might be provided to communications interface 324 via a channel 328. This channel 328 might carry signals and might be implemented using a wired or wireless communication medium. Some examples of a channel might include a phone line, a cellular link, an RF link, an optical link, a network interface, a local or wide area network, and other wired or wireless communications channels.

In this document, the terms "computer program medium" and "computer usable medium" are used to generally refer to media such as, for example, memory 308, storage unit 320, media 314, and signals on channel 328. These and other various forms of computer program media or computer usable media may be involved in carrying one or more sequences of one or more instructions to a processing device for execution. Such instructions embodied on the medium, are generally referred to as "computer program code" or a "computer program product" (which may be grouped in the form of computer programs or other groupings). When executed, such instructions might enable the computing module 300 to perform features or functions of the present invention as discussed herein.

While various embodiments of the present invention have been described above, it should be understood that they have been presented by way of example only, and not of limitation. Likewise, the various diagrams may depict an example architectural or other configuration for the invention, which is done to aid in understanding the features and functionality that can be included in the invention. The invention is not restricted to the illustrated example architectures or configurations, but the desired features can be implemented using a variety of alternative architectures and configurations. Indeed, it will be apparent to one of skill in the art how alternative functional, logical or physical partitioning and configurations can be implemented to implement the desired features of the present invention. Also, a multitude of different constituent module names other than those depicted herein can be applied to the various partitions. Additionally, with regard to flow diagrams, block diagrams, operational descriptions and method claims, the order in which the steps are presented herein shall not mandate that various embodiments be implemented to perform the recited functionality in the same order unless the context dictates otherwise. As will become apparent to one of ordinary skill in the art after reading this document, the illustrated embodiments and their various alternatives can be implemented without confinement to the illustrated examples. For example, block diagrams and their accompanying description should not be construed as mandating a particular architecture or configuration.

Terms and phrases used in this document, and variations thereof, unless otherwise expressly stated, should be construed as open ended as opposed to limiting. As examples of the foregoing: the term "including" should be read as meaning "including, without limitation" or the like; the term "example" is used to provide exemplary instances of the item in discussion, not an exhaustive or limiting list thereof; the terms "a" or "an" should be read as meaning "at least one," "one or more" or the like; and adjectives such as "conventional," "traditional," "normal," "standard," "known" and terms of similar meaning should not be construed as limiting the item described to a given time period or to an item available as of a given time, but instead should be read to encompass conventional, traditional, normal, or standard technologies that may be available or known now or at any time in the future. Likewise, where this document refers to technologies that would be apparent or known to one of ordinary skill in the art, such technologies encompass those apparent or known to the skilled artisan now or at any time in the future.

The presence of broadening words and phrases such as "one or more," "at least," "but not limited to" or other like phrases in some instances shall not be read to mean that the narrower case is intended or required in instances where such broadening phrases may be absent. The use of the term "module" does not imply that the components or functionality described or claimed as part of the module are all configured in a common package. Indeed, any or all of the various components of a module, whether control logic or other components, can be combined in a single package or separately maintained and can further be distributed in multiple groupings or packages or across multiple locations.

What is claimed is:

1. A method for creating a photolithographic component, comprising:
    determining a target pattern for a circuit layout, the target pattern comprising target features;
    identifying a set of periodic target features within the target pattern;
    calculating a relationship between feature and pitch for the set of periodic target features; and
    using a computer system to define a mask pattern from the target pattern using the relationship, wherein the mask pattern has a set of periodic mask features configured to result in projection of a first subset of the set of periodic target features when exposed to a first light source configuration that induces a first phase effect, and configured to result in projection of a second subset of the set of periodic target features when exposed to a second light source configuration that induces a second phase effect.

2. The method of claim 1, wherein the first phase effect is a caused by a diffraction order of a mask diffraction pattern and the second phase effect is a caused by a diffraction order of a mask diffraction pattern.

3. The method of claim 1, wherein the relationship between feature and pitch is a line width-to-pitch ratio for the set of periodic target features.

4. The method of claim 3, wherein the line width-to-pitch ratio for the set of periodic target features is smaller than a line width-to-pitch ratio for the set of periodic mask features.

5. The method of claim 1, wherein the first and second configurations include off-axis illumination settings, exposure dose, lens focus, exposure method, frequency of light, phase of light, polarization of light, and numerical-aperture of the lens.

6. The method of claim 1, wherein determining the mask pattern includes simulating the first phase effect of a light source on the mask pattern and simulating the second phase effect of a light source on the mask pattern to determine the mask pattern.

7. The method of claim 6, wherein the operations of simulating the first phase effect and simulating the second phase effect are performed iteratively or concurrently.

8. The method of claim 1, wherein determining the mask pattern includes determining a mask type, addition of non-printing mask features, adjusting mask features with respect to the target features, adjusting shape of mask features, determining optical constants for a mask material, and determining mask thickness.

9. The method of claim 1, further comprising outputting the mask pattern as a mask dataset.

10. The method of claim 1, wherein the set of periodic mask features are further configured to result in double patterning or self-aligned double patterning of the set of periodic target features.

11. A computer-aided design tool configured to generate photolithographic data for patterning a circuit layout, comprising:
    a processor;
    a memory connected to the processor; and
    a non-transitory computer readable medium having instructions embedded therein, the instructions configured to cause the processor to perform the operations of:
    determining a target pattern for the circuit layout, the target pattern comprising target features;
    identifying a set of periodic target features within the target pattern;
    calculating a relationship between line and pitch for the set of periodic target features;
    defining a mask pattern from the target pattern using the relationship, wherein the mask pattern has a set of periodic mask features configured to result in projection of a first subset of the set of periodic target features when exposed to a first light source configuration that induces a first phase effect, and configured to result in projection of a second subset of the set of periodic target features when exposed to a second light source configuration that induces a second phase effect; and
    outputting the mask pattern as a mask dataset.

12. The computer-aided design tool of claim 11, wherein the first phase effect is a caused by a diffraction order of a mask diffraction pattern and the second phase effect is a caused by a diffraction order of a mask diffraction pattern.

13. The computer-aided design tool of claim 11, wherein the relationship between feature and pitch is a line width-to-pitch ratio for the set of periodic target features.

14. The computer-aided design tool of claim 13, wherein the line width-to-pitch ratio for the set of periodic target features is smaller than a line width-to-pitch ratio for the set of periodic mask features.

15. The computer-aided design tool of claim 11, wherein the first and second configurations include off-axis illumination settings, exposure dose, lens focus, exposure method, frequency of light, phase of light, polarization of light, and numerical-aperture of the lens.

16. The computer-aided design tool of claim 11, wherein determining the mask pattern includes simulating the first phase effect of a light source on the mask pattern and simulating the second phase effect of a light source on the mask pattern to determine the mask pattern.

17. The computer-aided design tool of claim 16, wherein the operations of simulating the first phase effect and simulating the second phase effect are performed iteratively or concurrently.

18. The computer-aided design tool of claim 11, wherein determining the mask pattern includes determining a mask type, addition of non-printing mask features, adjusting mask features with respect to the target features, adjusting shape of mask features, determining optical constants for a mask material, and determining mask thickness.

19. The computer-aided design tool of claim 11, wherein the set of periodic mask features are further configured to result in double patterning or self-aligned double patterning of the set of periodic target features.

20. A computer program product comprising a non-transitory computer useable medium having computer program code embodied therein for enabling a computing device to perform the operations of:

determining a target pattern for a circuit layout, the target pattern comprising target features;

identifying a set of periodic target features within the target pattern;

calculating a relationship between line and pitch for the set of periodic target features;

defining a mask pattern from the target pattern using the relationship, wherein the mask pattern has a set of periodic mask features configured to result in projection of a first subset of the set of periodic target features when exposed to a first light source configuration that induces a first phase effect, and configured to result in projection of a second subset of the set of periodic target features when exposed to a second light source configuration that induces a second phase effect; and outputting the mask pattern as a mask dataset.

21. The computer program product of claim 20, wherein the first phase effect is a caused by a diffraction order of a mask diffraction pattern and the second phase effect is a caused by a diffraction order of a mask diffraction pattern.

22. The computer program product of claim 20, wherein the relationship between feature and pitch is a line width-to-pitch ratio for the set of periodic target features.

23. The computer program product of claim 22, wherein the line width-to-pitch ratio for the set of periodic target features is smaller than a line width-to-pitch ratio for the set of periodic mask features.

24. The computer program product of claim 20, wherein the first and second configurations include off-axis illumination settings, exposure dose, lens focus, exposure method, frequency of light, phase of light, polarization of light, and numerical-aperture of the lens.

25. The computer program product of claim 20, wherein determining the mask pattern includes simulating the first phase effect of a light source on the mask pattern and simulating the second phase effect of a light source on the mask pattern to determine the mask pattern.

26. The computer program product of claim 25, wherein the operations of simulating the first phase effect and simulating the second phase effect are performed iteratively or concurrently.

27. The computer program product of claim 20, wherein determining the mask pattern includes determining a mask type, addition of non-printing mask features, adjusting mask features with respect to the target features, adjusting shape of mask features, determining optical constants for a mask material, and determining mask thickness.

28. The computer program product of claim 20, wherein the set of periodic mask features are further configured to result in double patterning or self-aligned double patterning of the set of periodic target features.

* * * * *